United States Patent
Su

(10) Patent No.: US 7,506,092 B2
(45) Date of Patent: Mar. 17, 2009

(54) BRIDGE CARD FOR CONVERTING A BUS CONNECTION OF A PARALLEL DAUGHTER CARD MOUNTED THEREON TO A DIFFERENT BUS CONNECTION OF A MOTHER BOARD

(75) Inventor: Yi-Hsiung Su, Sanchung (TW)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 11/555,777

(22) Filed: Nov. 2, 2006

(65) Prior Publication Data
US 2007/0133188 A1   Jun. 14, 2007

(30) Foreign Application Priority Data
Dec. 5, 2005   (TW) .................................. 94142796

(51) Int. Cl.
*G06F 13/00*   (2006.01)
*H05K 1/14*   (2006.01)

(52) U.S. Cl. ...................... 710/301; 439/637; 361/736; 361/748; 361/760; 361/772; 361/785

(58) Field of Classification Search ................. 710/301, 710/315; 361/600–837; 439/637
See application file for complete search history.

(56) References Cited

U.S. PATENT DOCUMENTS

| | | | |
|---|---|---|---|
| 5,104,326 A * | 4/1992 | Smith et al. ................... 439/95 |
| 5,611,057 A | 3/1997 | Pecone et al. ................ 710/301 |
| 5,765,008 A | 6/1998 | Desai et al. | |
| 5,961,352 A | 10/1999 | Denny et al. ................ 439/637 |
| 6,477,603 B1 | 11/2002 | Locker et al. ................ 710/301 |
| 6,785,760 B2 | 8/2004 | Asselin ........................ 710/315 |
| 7,186,145 B1 * | 3/2007 | Feldman et al. ............. 439/638 |
| 2002/0004323 A1 * | 1/2002 | Azuma ......................... 439/79 |
| 2004/0059860 A1 * | 3/2004 | Liu et al. ..................... 710/313 |
| 2004/0185692 A1 * | 9/2004 | Boonsue ....................... 439/79 |
| 2004/0201956 A1 | 10/2004 | Conway ..................... 361/686 |
| 2004/0230861 A1 | 11/2004 | Bailey et al. ................... 711/6 |
| 2005/0017980 A1 * | 1/2005 | Chang et al. ................ 345/520 |
| 2005/0060481 A1 | 3/2005 | Belonoznik ................. 710/315 |
| 2005/0079743 A1 * | 4/2005 | Hou et al. ..................... 439/65 |
| 2005/0132110 A1 | 6/2005 | Daftardar .................... 710/104 |
| 2005/0215085 A1 * | 9/2005 | Mehta et al. ................... 439/65 |
| 2005/0227527 A1 * | 10/2005 | Diamond et al. ............ 439/325 |
| 2005/0270298 A1 * | 12/2005 | Thieret ........................ 345/502 |
| 2006/0193327 A1 * | 8/2006 | Arndt et al. ............. 370/395.21 |
| 2007/0112995 A1 * | 5/2007 | Manula et al. ............... 710/310 |

* cited by examiner

*Primary Examiner*—Glenn A Auve
(74) *Attorney, Agent, or Firm*—John E. Campbell

(57) ABSTRACT

The present invention discloses an apparatus for operatively connecting a PCI-X or AGP device card (having a PCI-X or AGP bus) to a PCI-E bus connection on a mother board by mounting the PCI-X or AGP device card to a right edge connector mounted on a surface of an adapter card, the adapter card having a PCI-X (or AGP) to PCI-E bridge circuit for interconnecting a PCI-X (or AGP) bus to a PCI-E bus.

6 Claims, 3 Drawing Sheets

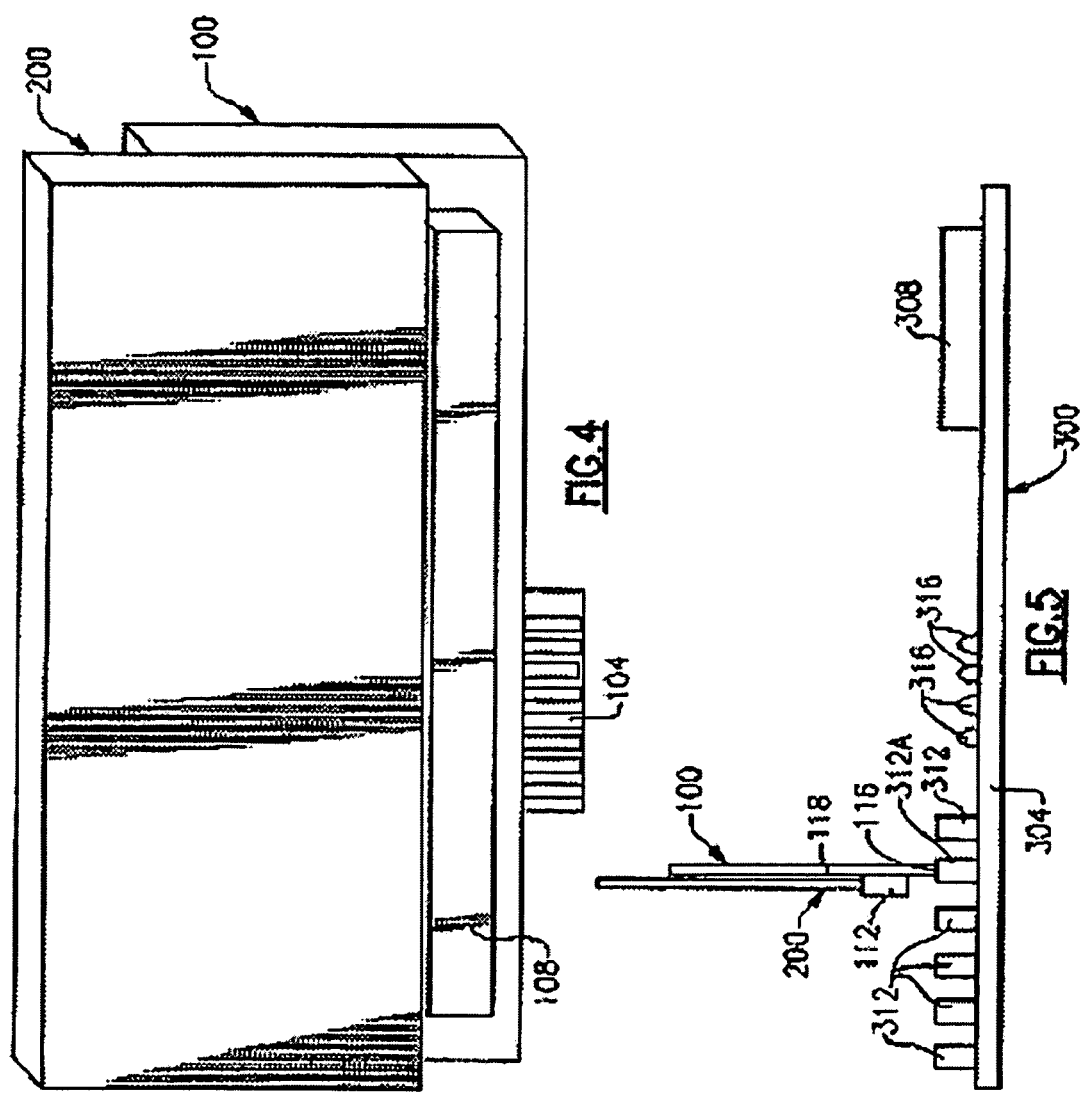

BRIDGE CARD FOR CONVERTING A BUS CONNECTION OF A PARALLEL DAUGHTER CARD MOUNTED THEREON TO A DIFFERENT BUS CONNECTION OF A MOTHER BOARD

FIELD OF THE INVENTION

This invention relates to a computer system, and more particularly to a method and apparatus for operatively connecting components to a computer system.

BACKGROUND OF THE INVENTION

The general structures of computer systems include one or more processing units connected to memory devices and input/output devices, wherein the memory device stores program instructions that are executed by the processing unit to perform the desired functions and the processing unit can transfer data to and from devices through buses.

The evolution history of computer buses includes ISA structures of '80s; and PCI structure, AGP structure, and PCI-X (PCI-extended) structures of '90s, and these structures cannot meet requirements of mass data transfer of peripheral cards nowadays. To solve the problem of insufficient bandwidth, PCI-SIG (PCI Special Interest Group) introduced the new standard for PC I/O: PCI EXPRESS® a trademark of PCI-SIG Corporation ((PCI-E), formerly 3GIO or 3rd Generation I/O) in 2002, and it will gradually replace the present structures.

In the transition from the old structure to the new structure, the originally used PCI-X buses will sooner or later be upgraded to PCI-E buses. In the beginning of the transition period, some PCI-X slots may remain in the boards. However, it is likely that there will be no PCI-X slots after the PCI-E structure totally replaces the PCI-X structure. For low-end computers with low costs (e.g., personal computers), it would be convenient and better to replace the old computers with new computers. For non low-end computers, the connected peripheral devices are relatively expensive (for example, a special storage system including 40 hard disk drives), and it will be problematic to directly replace the old computers with the new computers. For example, in a situation wherein the new computers have only PCI-E slots and the expensive peripheral devices only use PCI-X buses, the PCI-E slots of the new computers and the PCI-X buses of the peripheral devices cannot be connected if the old computers of the PCI-X structure are to be replaced by the new computers of the PCI-E structure. Alternatively, if some specific expensive peripheral devices with PCI-X buses are to be replaced by the peripheral device with PCI-E buses, the cost thereof will be largely increased.

Therefore, there is an urgent need for a mixed use of different bus structures of computers systems and peripheral devices during the transition period from the PCI-X structure to the PCI-E structure. The computer systems can be directly upgraded from the PCI-X structure to PCI-E structure, and the originally used expensive peripheral devices of the PCI-X structure can still be used.

SUMMARY OF THE INVENTION

In accordance with the objectives listed above, the present invention provides an apparatus for operatively connecting a first bus device to a second bus device, the method thereof, and the computer system thereof. During the transition period of buses of two different bus structures, when the computer systems of the old bus structure are upgraded to those of the new bus structure, the peripheral devices of the old bus structure can still be used thereon. Further, the purpose of a mixed use of different bus structures of computers systems and peripheral devices, and a reduction of the total cost are achieved.

A first general aspect of the present invention provides an apparatus for operatively connecting a PCI-E bus device to a second bus device, comprising: a body; a first connector disposed on the body for operatively connecting the PCI-E bus device; a second connector disposed on the body for operatively connecting the second bus device; and a bridge circuit disposed in the body for operatively connecting the first connector to the second connector.

Preferably, the first connector can be a golden finger. The PCI-E bus device can comprise a PCI-E slot connector disposed on a motherboard. The second connector can be a PCI-X slot connector. The second bus device can be selected from a group comprising a PCI-X bus device, a PCI bus device and an AGP bus device. The PCI-X bus device can be a PCI-X adapter, and the PCI-X adapter can comprise a male connector for operatively connecting the PCI-X slot connector. The first connector can be disposed on a first edge of the adapter body and the second connector can be disposed on a second surface of the adapter body. The first and second surfaces can be adjacent to each other and the angle between the first and second surfaces can be about 90 degrees. A connection direction of the PCI-X slot connector and the male connector of the PCI-X adapter can be substantially vertical to the first plane. The connection direction of the PCI-X slot connector and the male connector of the PCI-X adapter can be substantially parallel to the second plane. The bridge circuit can be integrated in a bridge chip. The bridge chip can be a PCI-E/PCI-X bridge chip.

A second general aspect of the present invention provides an apparatus for operatively connecting a first bus device to a second bus device, comprising: a body; a first connector disposed on a first edge of the body for operatively connecting the first bus device; a second connector disposed on a second surface of the body for operatively connecting the second bus device, wherein a connection direction of the second connector and the second bus device is substantially parallel to the second surface; a bridge circuit disposed in the body for operatively connecting the first connector to the second connector.

Preferably, the first and second surfaces can be adjacent to each other and the angle between the first and second surfaces can be about 90 degrees. The connection direction of the second connector and the second bus device can further be substantially vertical to the first edge.

A third general aspect of the present invention provides a computer system, comprising: a motherboard comprising an upper surface, wherein at least one connector is mounted on the upper surface; a non PCI-E bus device; and an adapter for operatively connecting the non PCI-E bus device to the at least one connector, wherein the adapter comprises an adapter body; a first connector for operatively connecting the at least one connector; a second connector operatively connecting the non PCI-E bus device; and a bridge circuit for operatively connecting the first connector to the second connector.

Preferably, the at least one connector can be a PCI-E slot connector. The second connector can be a PCI-X slot connector.

The non PCI-E bus device can be a PCI-X adapter, and the PCI-X adapter can comprise a male connector for operatively connecting the PCI-X slot connector.

A fourth general aspect of the present invention provides a method for operatively connecting a PCI-E bus device connector of a PCI-E bus device to a non PCI-E bus device connector of a non PCI-E bus device, the method comprising: providing the PCI-E bus device connector of the PCI-E bus device; providing the non PCI-E bus device connector of the non PCI-E bus device; providing an adapter device, the adapter device comprising an adapter body, a first adapter connector, a second adapter connector, and a bridge device; and using the adapter device to operatively connect the PCI-E bus device connector of the PCI-E bus device to the non PCI-E bus connector of the non PCI-E bus device.

The foregoing and other features of the invention will be apparent from the following more particular description of the embodiment of the invention.

BRIEF DESCRIPTION OF THE DRAWINGS

The embodiments of this invention will be described in detail, with reference to the following figures, wherein:

FIG. 4 schematically shows an adapter of a preferred embodiment of the present invention in connection with a PCI-X adapter;

FIG. 5 schematically shows an adapter of a preferred embodiment of the present invention, which are arranged on a motherboard of the present invention.

DETAILED DESCRIPTION OF THE INVENTION

Figure 1:
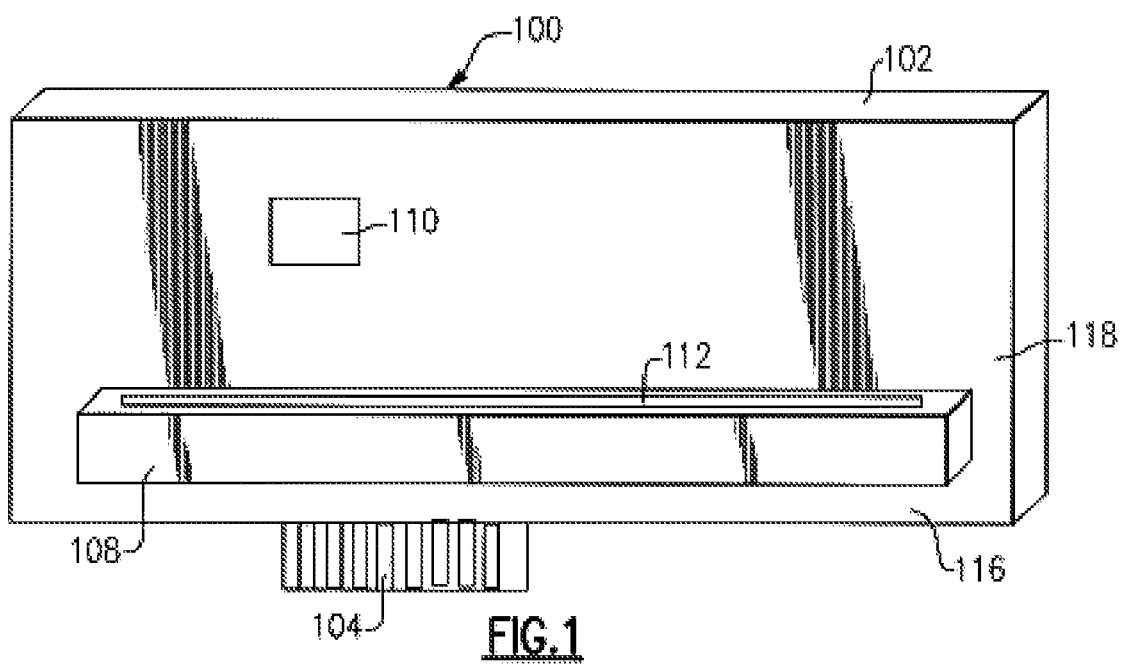
FIG. 1 schematically shows an adapter of a preferred embodiment of the present invention.

Referring to FIG. 1, an adapter 100 of a preferred embodiment of the present invention is schematically shown. The adapter 100 includes an adapter body 102, a male connector 104, a slot connector 108, and a bridge device 110.

The adapter body 102 is preferably rectangular, preferably having a surface 116 which surface is defined as a first plane and a surface 118 is defined as a second plane. The surfaces (planes) 116 and 118 are adjacent to each other, and the angle between the first edge (plane) 116 and second surface (plane) 118 is about 90 degrees. The male connector 104 is disposed on the first edge 116, and the slot connector 108 is disposed on the second surface 118. The male connector 104 is preferably a golden finger connector, and the slot connector 108 has a slot 112. The bridge device is a bridge chip, for example, a PCI-E/PCI-X bridge chip.

Figure 2:
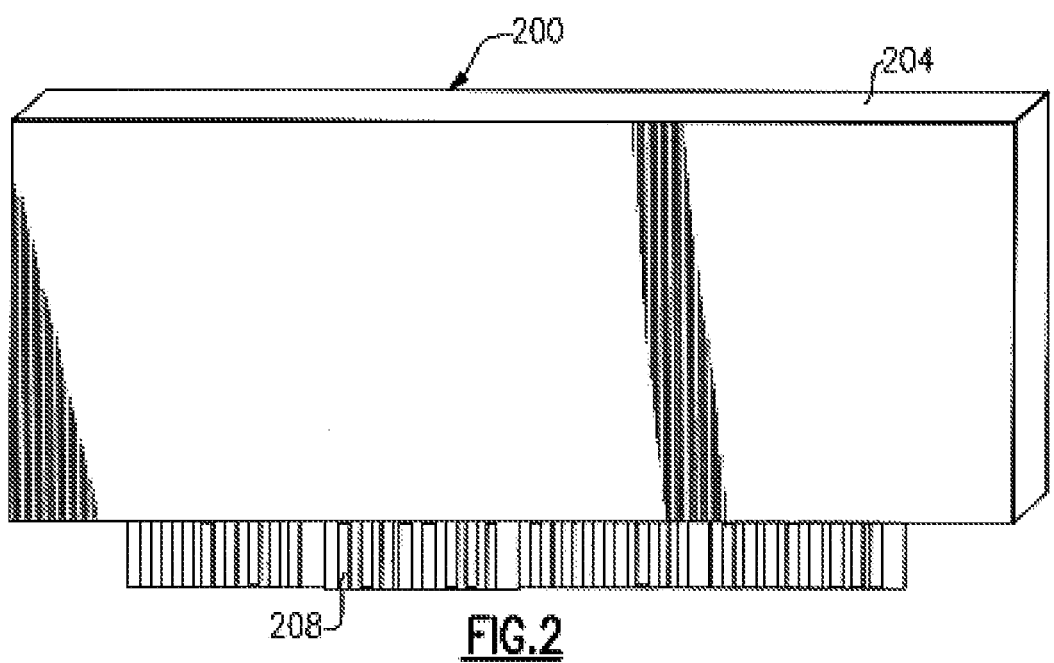
FIG. 2 schematically shows a prior art PCI-X adapter.

FIG. 2 schematically shows a prior art PCI-X adapter 200, wherein the PCI-X adapter 200 includes a PCI-X adapter body 204 and a male connector 208.

Figure 3:
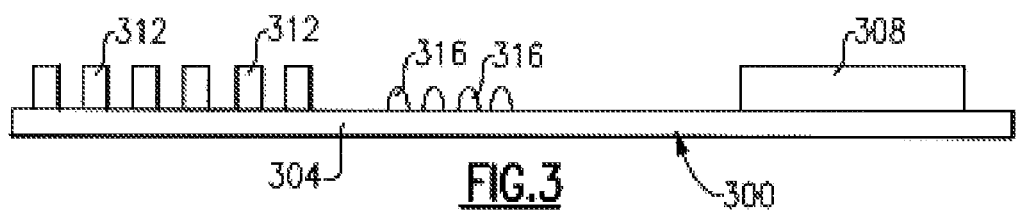
FIG. 3 schematically shows an allocation on a prior art motherboard of a computer system.

FIG. 3 shows an allocation on a prior art motherboard of a computer system. It schematically depicts a motherboard 304, a processor slot 308 thereon, PCI-E slot connectors 312 thereon, system memory slots 316 thereon. In this embodiment, PCI-E slot connectors 312 include six slot connectors.

As described previously, the motherboard 308 tends to be equipped only and all with PCI-E slot connectors 312 in accordance with the evolution of technology, and no PCI-X slot connectors or other connectors will be used. When the computer systems are upgraded to be of PCI-E structure, the peripheral devices of the PCI-X structure or other bus structures cannot be used, it results in the above-mentioned problems. Especially in the case of expensive peripheral devices, the problem will be more serious.

The present invention provides solutions to the above problem. Please refer to FIG. 1, FIG. 2, and FIG. 3, the adapter 100 is used to operatively connect PCI-E slot connector 312 to the male connector 208 of the PCI-X adapter 200. The adapter 100 includes an adapter body 102; a male connector 104 disposed on the adapter body 102 for operatively connecting the PCI-E slot connector 312; a slot connector 108 disposed on the adapter body 102 for operatively connecting the male connector 208 of the PCI-X adapter 200; and a bridge device 110 disposed in the adapter body 102 for operatively connecting the male connector 104 to the slot connector 108.

FIG. 4 schematically shows an adapter 100 of a preferred embodiment of the present invention in operative connection with a PCI-X adapter 200, wherein the adapter 100 of the present invention and the PCI-X adapter 200 are adjacent to each other, and the width of the connected adapter 100 and the PCI-X adapter 200 is about the width of two slots.

FIG. 5 schematically shows an adapter 100 of a preferred embodiment of the present invention, which is arranged on a prior art motherboard 300. The adapter 100 of the present invention is operatively connected with the PCI-E slot connector 312A, and the adapter 100 of the present invention has a slot connector 112 to which the PCI-X adapter 200 is connected.

Referring to FIGS. 1-5, the male connector 104 is disposed on the first edge 116, and the slot connector 108 is disposed on the second surface 118. The connection direction of the male connector 208 of the PCI-X adapter 200 and the slot connector 112 of the adapter 100 of the present invention is substantially vertical to the first plane 116. The connection direction of the male connector 208 of the PCI-X adapter 200 and the slot connector 112 of the adapter 100 of the present invention is further substantially parallel to the second plane 118.

According to the above embodiment, the total cost of the computer systems and peripheral devices is relatively reduced during the transition period from the non PCI-E structure (for example, PCI-X structure) to the PCI-E structure. Especially for non low-end computer systems (for example, the servers or above) of or above the server level, most of more expensive peripheral devices of originally used non PCI-E structure can still be used in PCI-E structure, and the occupied width is the width of two slots.

Figure 6:
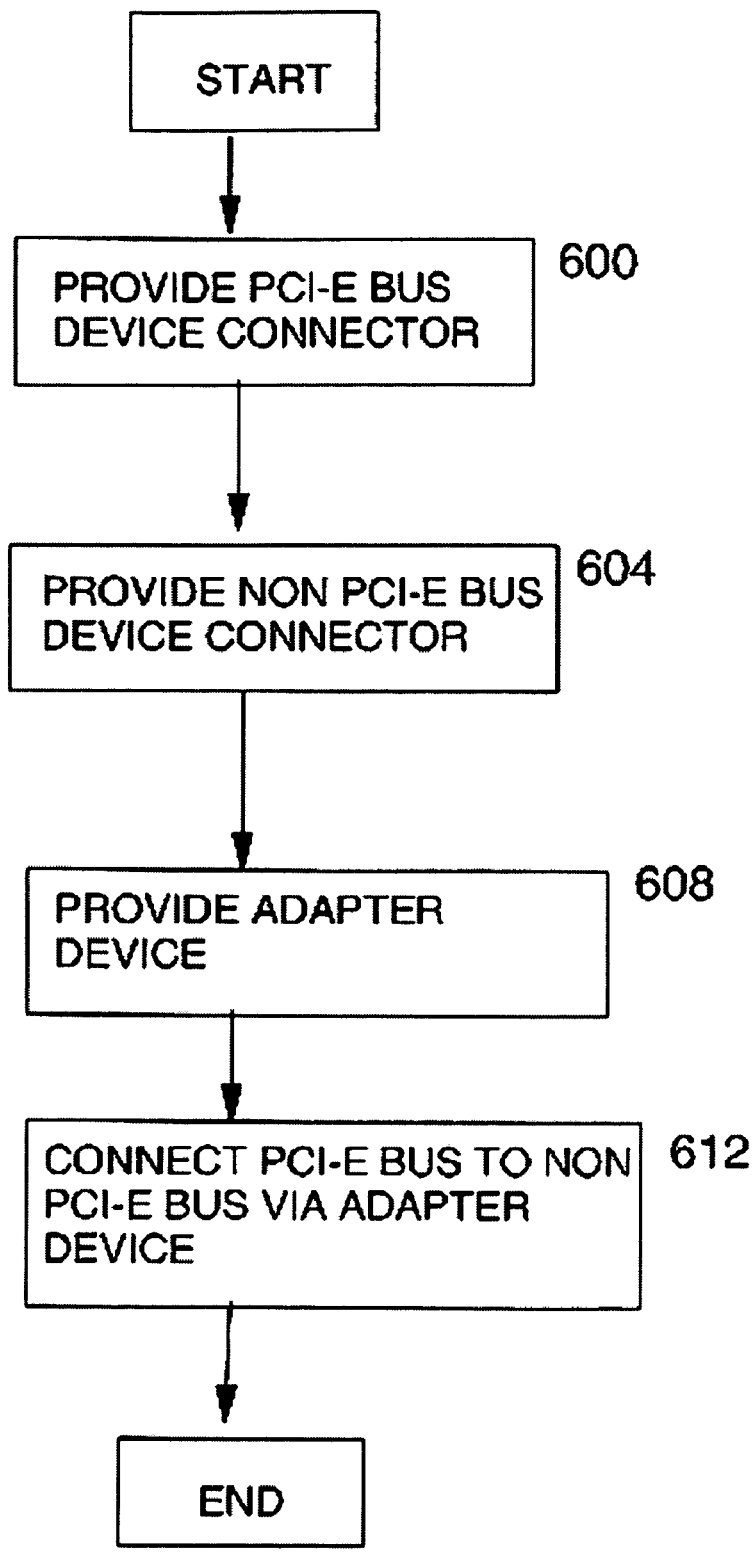
FIG. 6 schematically shows a method for operatively connecting a PCI-E bus device to a non PCI-E bus device.

FIG. 6 schematically shows a method for operatively connecting a PCI-E bus device to a non PCI-E bus device (e.g., a PCI-X device). The PCI-E bus device has a PCI-E bus device connector and the non PCI-E bus device has a non PCI-E bus device connector. The method includes step 600 of providing the PCI-E bus device connector of the PCI-E bus device; step 604 of providing the non PCI-E bus device connector of the non PCI-E bus device; step 608 of providing an adapter device, the adapter device comprising an adapter body, a first adapter connector, a second adapter connector, and a bridge device; and step 612 of using the adapter device to operatively connect the PCI-E bus device connector of the PCI-E bus device to the non PCI-E bus connector of the non PCI-E bus device.

In more details, the first adapter connector operatively connects to the PCI-E bus device connector of the PCI-E bus device; the second adapter connector operatively connects to the non PCI-E bus device connector of the non PCI-E bus device; and the bridge device operatively connects the first adapter connector to the second adapter connector. The adapter body is preferably substantially rectangular, the first adapter connector is disposed on a first edge of the adapter body, and the second adapter connector is disposed on a second surface of the adapter body. The first and second surfaces are adjacent to each other and the angle between the first and second surfaces can be about 90 degrees. A connection direction of the second adapter connector and the non PCI-E bus device connector of the non PCI-E bus device is substantially vertical to the first edge. The connection direction of the second adapter connector and the non PCI-E bus device connector of the non PCI-E bus device is further substantially parallel to the second surface.

In one embodiment, the first adapter connector is a male connector, the second adapter connector is a PCI-X slot connector, the PCI-E bus connector is a PCI-E slot connector disposed on a motherboard, the non PCI-E bus device is a PCI-X adapter, and the non PCI-E bus device connector is a male connector.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method, comprising:
on a first portion of an adapter card having no more than 2 connectors, the first portion comprising a first male edge connector formed from said adapter card, said first male edge connector comprising a first plurality of electrical conductors, said first male edge connector comprising a first edge for insertion into a first female connector of a plurality of female connectors of a mother board, the first female connector substantially parallel with said inserted first edge, the female connectors disposed substantially in parallel on said motherboard for accepting corresponding adapter cards having a standard size mounting a right angle connector on a first portion of said adapter card, wherein said right angle connector is mounted substantially parallel to said first edge, said right angle connector comprising a second plurality of electrical conductors, said right angle connector oriented to accept insertion of a second male edge connector of a daughter card having said standard size, said second male edge connector formed from a portion of said daughter card, said second male edge connector comprising a second edge for insertion into said mounted right angle connector; and
mounting a bridge circuit on said adapter card wherein at least a portion of said right angle connector is disposed between said bridge circuit and said first edge connector, said bridge circuit adapted to interconnect a first bus with a second bus, wherein said adapter card electrically connects directly, said first bus of said bridge circuit to said first plurality of electrical conductors and wherein said adapter card electrically connects directly, said second bus of said bridge circuit to said second plurality of electrical conductors.

2. The method according to claim 1, comprising the further steps of:
plugging said daughter card into said right angle connector of said adapter card; and
plugging said adapter card into said first female connector of said mother board.

3. The method according to claim 2, wherein said first male edge connector and said second male edge connector comprise golden finger connectors.

4. The method according to claim 2, wherein said first plurality is a different number than said second plurality.

5. The method according to claim 4, wherein said first plurality is less than said second plurality.

6. The method according to claim 5, wherein said plugged standard sized daughter card extends above the plugged adapter card.

* * * * *